(12) United States Patent
Huang et al.

(10) Patent No.: US 9,379,119 B1
(45) Date of Patent: Jun. 28, 2016

(54) STATIC RANDOM ACCESS MEMORY

(71) Applicant: UNITED MICROELECTRONICS CORP., Hsin-Chu (TW)

(72) Inventors: Chun-Hsien Huang, Tainan (TW); Yu-Tse Kuo, Tainan (TW); Shu-Ru Wang, Taichung (TW); Yu-Hsiang Hung, Tainan (TW); Ssu-I Fu, Kaohsiung (TW); Chih-Kai Hsu, Tainan (TW); Jyh-Shyang Jenq, Pingtung County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/749,623

(22) Filed: Jun. 24, 2015

(30) Foreign Application Priority Data

Jun. 9, 2015 (CN) .......................... 2015 1 0311537

(51) Int. Cl.
*H01L 23/48* (2006.01)
*H01L 27/11* (2006.01)
*H01L 23/522* (2006.01)
*H01L 23/528* (2006.01)
*H01L 27/088* (2006.01)
*H01L 27/02* (2006.01)
*H01L 27/092* (2006.01)

(52) U.S. Cl.
CPC .......... *H01L 27/1104* (2013.01); *H01L 23/528* (2013.01); *H01L 23/5226* (2013.01); *H01L 27/0207* (2013.01); *H01L 27/0886* (2013.01); *H01L 27/0924* (2013.01)

(58) Field of Classification Search
CPC .............. H01L 23/5226; H01L 23/528; H01L 27/1104; H01L 27/0924; H01L 27/0207; H01L 27/0886
See application file for complete search history.

(56) References Cited

U.S. PATENT DOCUMENTS

| | | | | |
|---|---|---|---|---|
| 8,379,458 B1* | 2/2013 | Or-Bach | ........... | H01L 21/76254 365/177 |
| 8,581,349 B1* | 11/2013 | Sekar | ................... | H04L 27/2436 257/402 |
| 8,907,316 B2* | 12/2014 | Lung | ................... | G11C 13/0004 257/4 |
| 8,937,832 B2* | 1/2015 | Kitagawa | ................ | H01L 43/08 365/158 |
| 8,952,547 B2* | 2/2015 | Liaw | ....................... | H01L 27/11 257/775 |
| 9,012,276 B2* | 4/2015 | Kapoor | ............. | H01L 29/78654 438/198 |
| 9,041,117 B2* | 5/2015 | Liaw | .................... | G11C 11/412 257/225 |
| 2012/0037996 A1* | 2/2012 | Schultz | ............. | H01L 21/76895 257/368 |
| 2013/0258759 A1 | 10/2013 | Liaw | | |
| 2014/0241027 A1 | 8/2014 | Hung | | |

OTHER PUBLICATIONS

Hsu, Title of Invention: Static Random Access Memory, U.S. Appl. No. 14/724,775, filed May 28, 2015.

* cited by examiner

*Primary Examiner* — Nicholas Tobergte
(74) *Attorney, Agent, or Firm* — Winston Hsu; Scott Margo

(57) ABSTRACT

A static random access memory (SRAM) is disclosed. The SRAM includes a plurality of SRAM cells on a substrate, in which each of the SRAM cells further includes: a gate structure on the substrate, a plurality of fin structures disposed on the substrate, where each fin structure is arranged perpendicular to the arrangement direction of the gate structure, a first interlayer dielectric (ILD) layer around the gate structure, a first contact plug in the first ILD layer, where the first contact plug is strip-shaped and contacts two different fin structures; and a second ILD layer on the first ILD layer.

18 Claims, 5 Drawing Sheets

STATIC RANDOM ACCESS MEMORY

BACKGROUND OF THE INVENTION

1. Field of the Invention

The invention relates to a static random access memory (SRAM), and more particularly, to a SRAM having two interlayer dielectric (ILD) layers and contact plugs formed among the two ILD layers.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as pitch of the exposure process decreases, it has been difficult for the current SRAM architecture to produce desirable patterns. Hence, how to enhance the current SRAM architecture for improving exposure quality has become an important task in this field.

SUMMARY OF THE INVENTION

A static random access memory (SRAM) is disclosed. The SRAM includes a plurality of SRAM cells on a substrate, in which each of the SRAM cells further includes: a gate structure on the substrate, a plurality of fin structures disposed on the substrate, wherein each fin structure is arranged perpendicular to the arrangement direction of the gate structure, a first interlayer dielectric (ILD) layer around the gate structure, a first contact plug in the first ILD layer, wherein the first contact plug is strip-shaped and contacts two different fin structures; and a second ILD layer on the first ILD layer.

In summary, the present invention provides a 6T-SRAM, the key feature is it comprises two ILDs, and the first contact plug is only disposed within the bottom ILD. The first contact plug is electrically connected to the drain of the first pull-up transistor, the drain of the first pull-down transistor, and the drain of the first access transistor of the 6T-SRAM simultaneously, or in another case, electrically connected to the drain of the second pull-up transistor, the drain of the second pull-down transistor, and the drain of the second access transistor of the 6T-SRAM simultaneously. In this arrangement, there is no need to have any other contact plugs disposed right above the first contact plug, thereby decreasing the pattern density of the upper ILD, and improving the yield.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
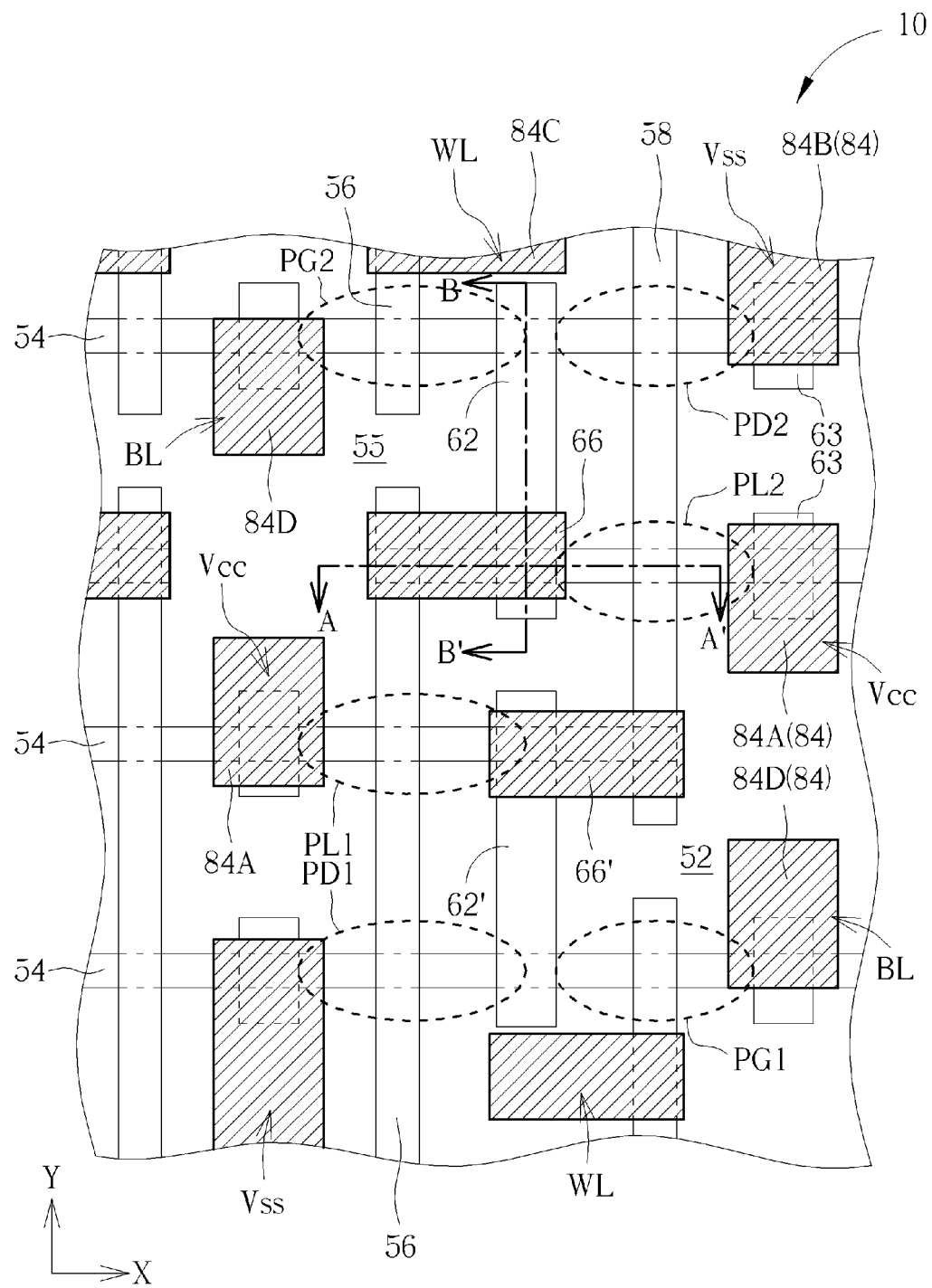
FIG. 1 illustrates a layout diagram of a SRAM according to a first preferred embodiment of the present invention.
Figure 2:
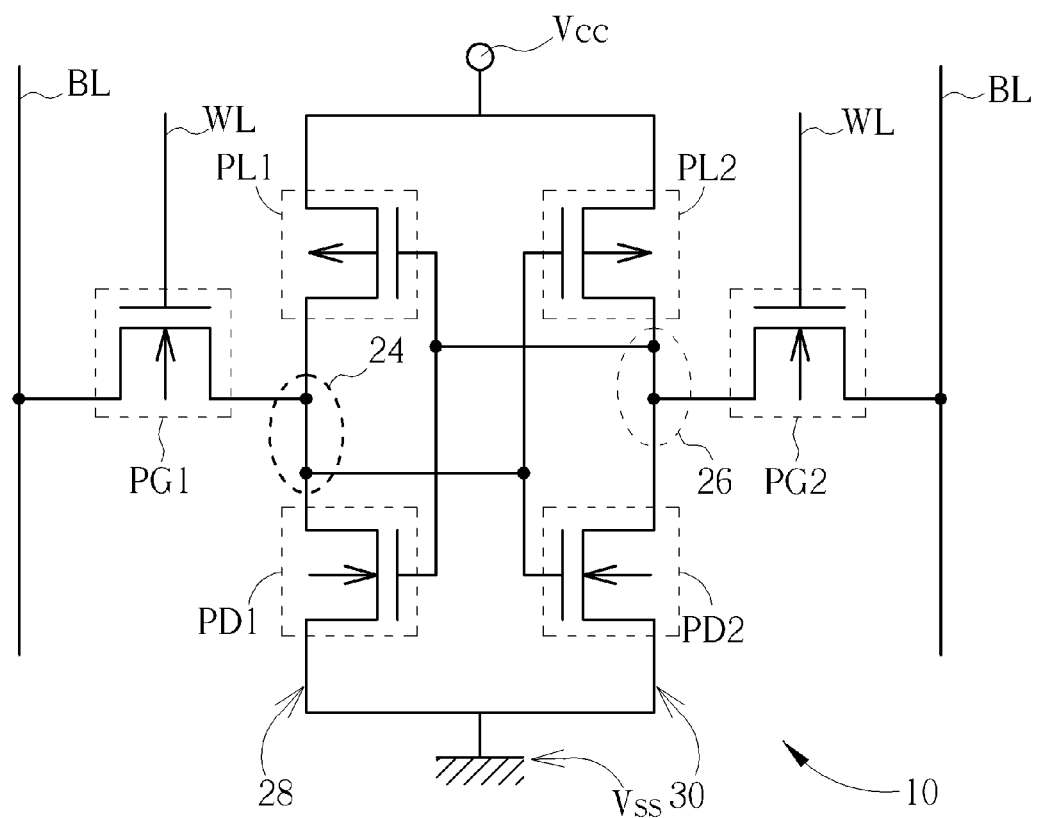
FIG. 2 illustrates a circuit diagram of a six-transistor SRAM (6T-SRAM) cell of a SRAM of the present invention.

Referring to FIGS. 1-2, FIG. 1 illustrates a layout diagram of a static random access memory (SRAM) according to a preferred embodiment of the present invention, and FIG. 2 illustrates a circuit diagram of a six-transistor SRAM (6T-SRAM) cell of a SRAM of the present invention.

As shown in FIGS. 1-2, the SRAM device of the present invention preferably includes at least one SRAM cell, each SRAM cell including a six-transistor SRAM (6T-SRAM) cell 10.

In this embodiment, each 6T-SRAM cell 10 is composed of a first pull-up transistor PL1, a second pull-up transistor PL2, a first pull-down transistor PD1, a second pull-down transistor PD2, a first access transistor PG1 and a second access transistor PG2. These six transistors constitute a set of flip-flops. The first and the second pull-up transistors PL1 and PL2, and the first and the second pull-down transistors PD1 and PD2 constitute a latch that stores data in the storage nodes 24 and 26. Since the first and the second pull-up transistors PL1 and PL2 act as power load devices, they can be replaced by resistors. Under this circumstance, the static random access memory becomes a four-transistor SRAM (4T-SRAM). In this embodiment, the first and the second pull-up transistors PL1 and PL2 preferably share a source/drain region and electrically connect to a voltage source Vcc, the first and the second pull-down transistors PD1 and PD2 share a source/drain region and electrically connect to a voltage source Vss.

Preferably, the first and the second pull-up transistors PL1 and PL2 of the 6T-SRAM cell 10 are composed of p-type metal oxide semiconductor (PMOS) transistors; the first and the second pull-down transistors PD1 and PD2, and first and the second access transistors PG1 and PG2 are composed of n-type metal oxide semiconductor (NMOS) transistors. The first pull-up transistor PL1 and the first pull-down transistor PD1 constitute an inverter, which further form a series circuit 28. One end of the series circuit 28 is connected to a voltage source Vcc and the other end of the series circuit 28 is connected to a voltage source Vss. Similarly, the second pull-up transistor PL2 and the second pull-down transistor PD2 constitute another inverter and a series circuit 30. One end of the series circuit 30 is connected to the voltage source Vcc and the other end of the series circuit 30 is connected to the voltage source Vss.

The storage node 24 is connected to the respective gates of the second pull-down transistor PD2 and the second pull-up transistor PL2. The storage node 24 is also connected to the drains of the first pull-down transistor PD1, the first pull-up transistor PL1, and the first access transistor PG1. Similarly, the storage node 26 is connected to the respective gates of the first pull-down transistor PD1 and first the pull-up transistor PL1. The storage node 26 is also connected to the drains of the second pull-down transistor PD2, the second pull-up transistor PL2, and the second access transistor PG2. The gates of the first and the second access transistors PG1 and PG2 are respectively coupled to a word line (WL), and the sources are coupled to a relative data line (BL).

In this embodiment, the SRAM cell 10 is disposed on a substrate 52, such as a silicon substrate or silicon-on-insulator (SOI) substrate. A plurality of fin-shaped structures 54 are formed on the substrate 52 and shallow trench isolations (STIs) 55 are formed around the fin-shaped structures 54. A plurality of gate structures 56, 58 are formed on the substrate 52, wherein the arrangement direction of each fin-shaped structure 54 is perpendicular to the arrangement direction of the gate structure 56, 58.

In addition, as shown in FIG. 1, the substrate 52 further comprises a plurality of first contact plugs 62 and a plurality of second contact plugs 66 disposed thereon. Each first contact plug 62 is preferably a long strip shaped structure, directly contacting two fin-shaped structures 54, the extending direction of each first contact plug 62 (such as Y-axis) being perpendicular to the arrangement direction of the fin-shaped structures 54 (such as X-axis), and each second contact plug 66 is preferably a long strip shaped structure too, the extending direction of each second contact plug 66 being preferably parallel to the arrangement direction of the fin-shaped structures 54 (such as both are X-axis). Besides, the substrate 52 further comprises a plurality of the contact plugs 84 disposed thereon, including 84A, 84B, 84C and 84D, electrically connected to the voltage source Vcc, voltage source Vss, word line WL and bit line BL respectively.

Figure 3:
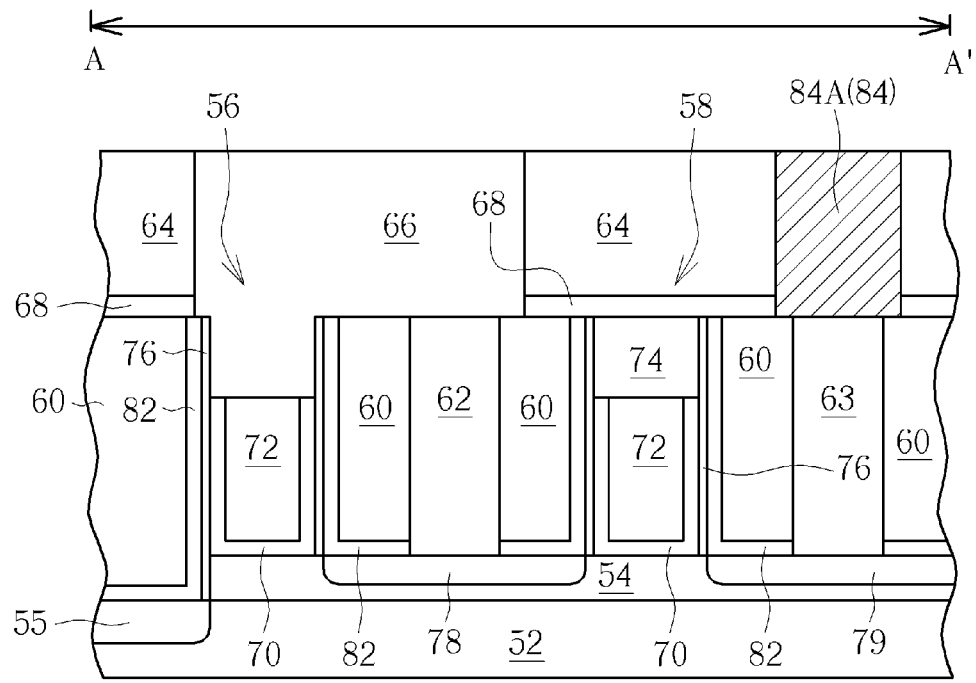
FIG. 3 illustrates a cross-sectional view of FIG. 1 along the sectional line A-A'.

FIG. 3 illustrates a cross-sectional view of FIG. 1 along the sectional line A-A'. As shown in FIG. 3, 6T SRAM cell 10 include gate structures 56 and 58 disposed on the substrate 52, a first interlayer dielectric (ILD) 60 around the gate structures 56 and 58, a first contact plug 62 disposed within the first ILD layer 60, a second ILD layer 64 disposed on the first ILD layer 62, a second contact plug 66 in the second ILD layer 64 and electrically connected to the first contact plug 62, and a stop layer 68 disposed between the first ILD layer 60 and the second ILD layer 64. Each of the gate structures 56 and 58 is composed of a metal gate having high-k dielectric layer (not shown), U-shaped work function metal layer 70, low resistance metal layer 72, and hard mask 74, and elements including spacers 76, drain region 78, source region 79, selective epitaxial layer (not shown), and contact etch stop layer (CESL) 82 are formed adjacent to two sides of the gate structures 56 and 58. In addition, as shown in FIG. 2, the structure further comprises at least a bottom plug 63 disposed on the source region 79, the bottom plug 63 mentioned above disposed in the first ILD layer 60, and electrically connected to the contact plug 84A(84). Each contact plug 84 may be a single layer or a multiple layer contact structure. It is noteworthy that since the gate structure 56 is electrically connected to the second contact plug 66, there is no hard mask 74 disposed on the top of the gate structure 56. On the other hand, since the gate structure 58 does not need to electrically connect to the second contact plug 66, the hard mask 74 is disposed on the top of the gate structure 56.

Figure 4:
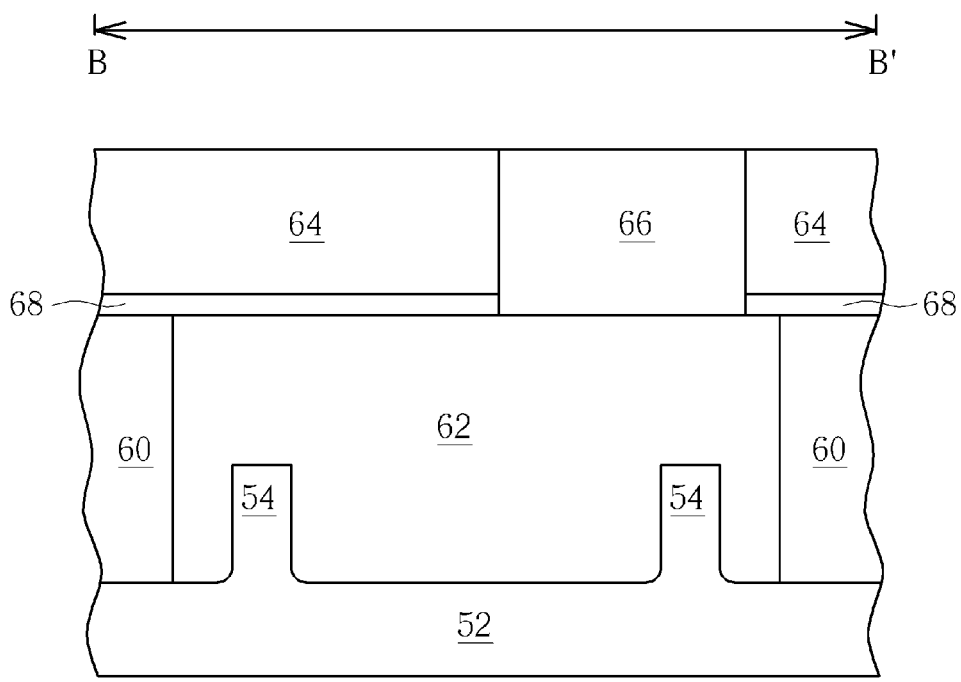
FIG. 4 illustrates a cross-sectional view of FIG. 1 along the sectional line B-B'.

FIG. 4 illustrates a cross-sectional view of FIG. 1 along the sectional line B-B'. As shown in FIG. 4, the first contact plug 62 directly contacts two fin-shaped structures 54.

Please refer to FIGS. 1,2 and 4. The first contact plug 62 is disposed in the first ILD layer 60, and electrically connected to the drain of the second pull-up transistor PL2, the drain of the second pull-down transistor PD2, and the drain of the second access transistor PG2; similarly, another first contact plug 62' is electrically connected to the drain of the first pull-up transistor PL1, the drain of the first pull-down transistor PD1, and the drain of the first access transistor PG1.

Besides, please refer to FIGS. 1-3, the second contact plug 66 is disposed in the second ILD layer 64, electrically connected to the drain of the second pull-up transistor PL2 and the gate of the first pull-up transistor PL1; similarly, another second contact plug 66' is electrically connected to the drain of the first pull-up transistor PL1 and the gate of the second pull-up transistor PL2. Therefore, in this embodiment, the first contact plugs 62, 62' and the bottom plugs 63 are disposed in the first ILD layer 60; the second contact plugs 66, 66' and the contact plugs 84A-84D are disposed in the second ILD layer 64. The plugs that are disposed in different levels can be formed through different photolithography processes. In this way, during the manufacturing process, the density of the contact patterns can be decreased, thereby preventing the shorting issues from happening.

The following description will detail the different embodiments of the SRAM of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
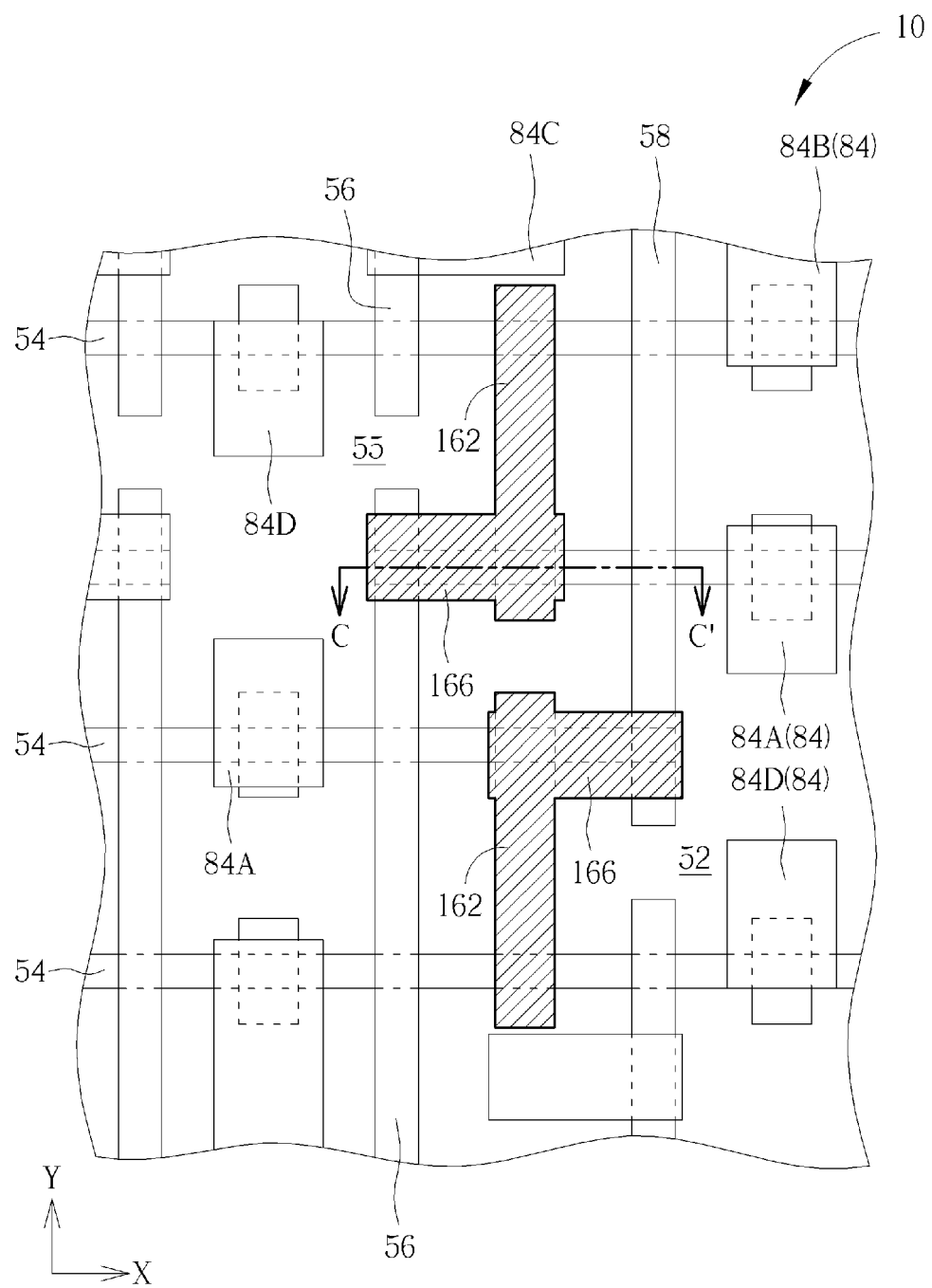
FIG. 5 illustrates a layout diagram of a SRAM according to a second preferred embodiment of the present invention.
Figure 6:
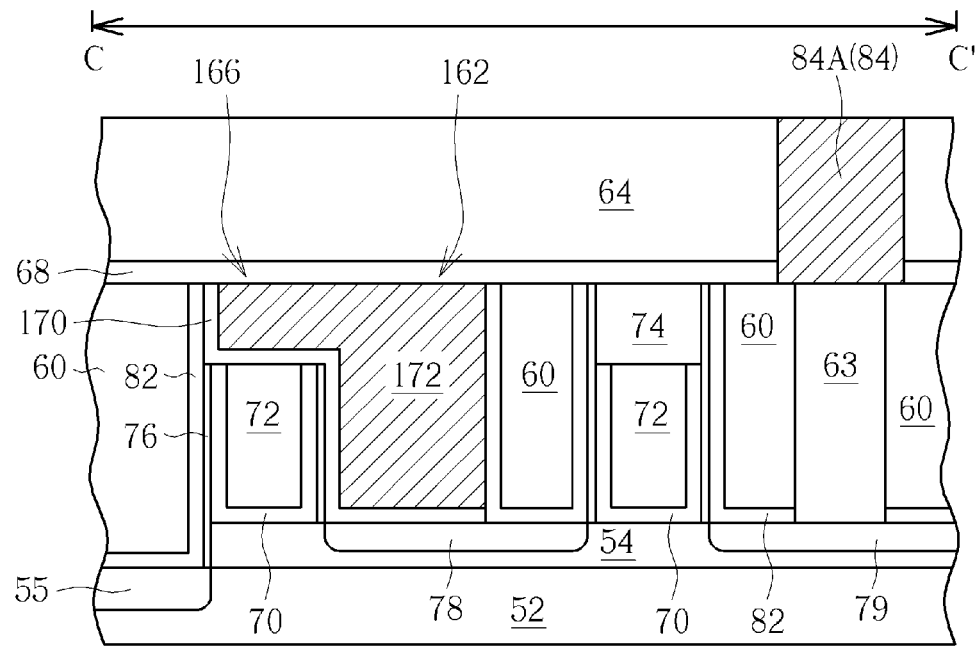
FIG. 6 illustrates a cross-sectional view of FIG. 5 along the sectional line C-C'.

FIG. 5 illustrates a layout diagram of a static random access memory (SRAM) according to a second preferred embodiment of the present invention, and FIG. 6 illustrates a cross-sectional view of FIG. 5 along the sectional line C-C'. The difference between this embodiment and the first preferred embodiment is in this embodiment, both the first contact plug 162 and the second contact plug 166 are disposed within the first ILD layer 60, and the first contact plug 162 directly contacts the second contact plug 166. During the manufacturing process, since the pattern density is usually high, considering the process difficulties, a double-patterning process can be used. In this embodiment, the first contact plug 162 and the second contact plug 166 are formed through different photolithography and etching processes. In other words, the recesses (not shown) of the first contact plug 162 and the second contact plug 166 are formed individually, wherein the two recesses directly contact to each other. Afterwards, a barrier layer 170 and a metal layer 172 are then filled in the two recesses simultaneously, so as to form the first contact plug 162 and the second contact plug 166. Therefore, both the first contact plug 162 and the second contact plug 166 are disposed in the first ILD layer 60 and are a monolithically formed structure. In this embodiment, there are no other contact plugs disposed right above the first contact plug 162, thereby decreasing the pattern density within the second ILD layer 64. Preferably, similar to the first preferred embodiment, the first contact plug 162 extends along a first direction (such as Y-axis), and the second contact plug 166 extends along a second direction (such as X-axis). Except for the features mentioned above, the other components, material properties, and manufacturing method of this embodiment are similar to those in the first preferred embodiment detailed above and will not be redundantly described.

Figure 7:
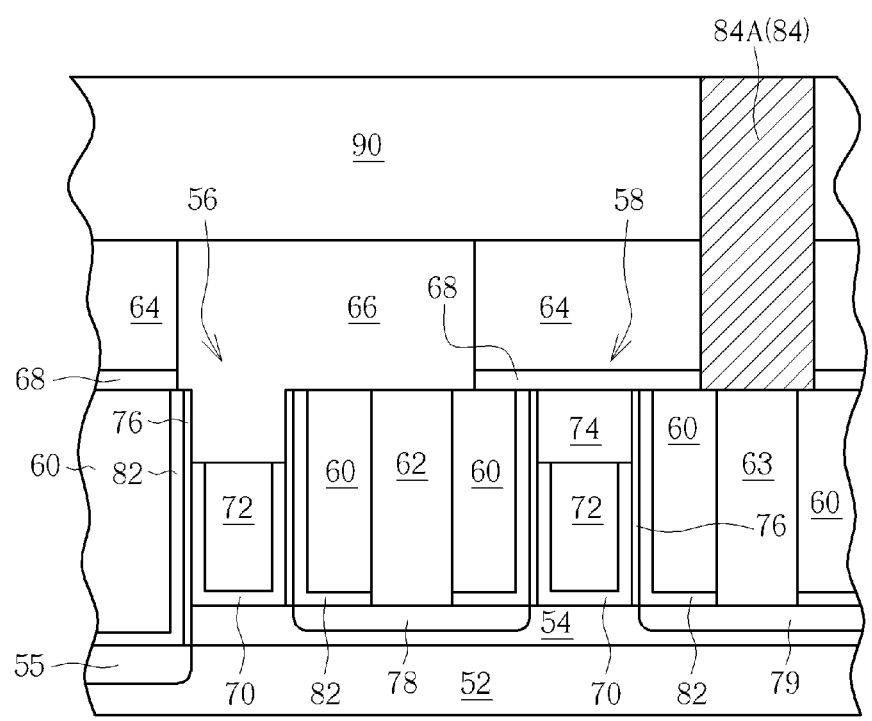
FIG. 7 illustrates a cross-sectional view of a SRAM according to a third preferred embodiment of the present invention.

FIG. 7 illustrates a cross-sectional view of the SRAM according to the third preferred embodiment of the present invention. This embodiment is substantially similar to the first preferred embodiment mentioned above, and has the same top view diagram (please refer to FIG. 1). The difference between these two embodiments is this embodiment further comprises a third ILD layer 90 disposed on the second ILD layer 64, the contact plugs 84A-84D being formed after the third ILD layer 90 is formed. Therefore, the contact plugs 84A-84D are disposed within the second ILD layer 64 and within the third ILD layer 90 simultaneously, and are electrically connected to the bottom plug 63. In other words, in this embodiment, the second contact plugs and the contact plugs 84A-84D are formed through different photolithography steps. In this way, after the second contact plugs 66 are formed, the contact plugs 84A-84D are then formed within the third ILD layer 90 and within the second ILD layer 64, further decreasing the pattern density in the second ILD layer 64 and in the third ILD layer 90. Besides, the feature of this embodiment can be combined with the second preferred embodiment too, and it should also be within the scope of the present invention.

In summary, the present invention provides a 6T-SRAM, the key feature is it comprises two ILD layers, and the first contact plug is only disposed within the bottom ILD layer. The first contact plug is electrically connected to the drain of the first pull-up transistor, the drain of the first pull-down transistor, and the drain of the first access transistor simultaneously, or in another case, electrically connected to the drain of the second pull-up transistor, the drain of the second pull-down transistor, and the drain of the second access transistor. In this arrangement, there is no need to have any other contact plugs disposed right above the first contact plug, thereby decreasing the pattern density of the upper ILD layer, and improving the yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM), comprising:
   a plurality of SRAM cells on a substrate, wherein each of the SRAM cells comprises:
   a gate structure on the substrate;
   at least one fin-shaped structure disposed on the substrate, wherein the arrangement direction of the fin-shaped structure is perpendicular to the arrangement direction of the gate structure;
   a first interlayer dielectric (ILD) layer around the gate structure;
   a first contact plug in the first ILD layer, wherein the first contact plug is a strip-shaped structure, and directly contacts two fin-shaped structures; and
   a second ILD layer on the first ILD layer.

2. The SRAM of claim 1, wherein each of the SRAM cells comprises a first pull-up transistor, a second pull-up transistor, a first pull-down transistor, a second pull-down transistor, a first access transistor and a second access transistor.

3. The SRAM of claim 2, wherein the first contact plug is electrically connected to a drain of the first pull-up transistor, a drain of the first pull-down transistor and a drain of the first access transistor.

4. The SRAM of claim 2, wherein the first contact plug is electrically connected to a drain of the second pull-up transistor, a drain of the second pull-down transistor and a drain of the second access transistor.

5. The SRAM of claim 2, further comprising a second contact plug, wherein the second contact plug is electrically connected to a drain of the second pull-up transistor and a gate of the first pull-up transistor.

6. The SRAM of claim 5, wherein the second contact plug is disposed within the second ILD layer.

7. The SRAM of claim 5, wherein the second contact plug is disposed within the first ILD layer.

8. The SRAM of claim 7, wherein the second contact plug and the first contact plug are a monolithically formed structure, and the second contact plug directly contacts the first contact plug.

9. The SRAM of claim 5, wherein the extending direction of the second contact plug is parallel to the arrangement direction of each fin-shaped structure.

10. The SRAM of claim 2, further comprising at least two word lines, electrically connected to a gate of the first access transistor and a gate of the second access transistor.

11. The SRAM of claim 2, further comprising at least two bit lines, electrically connected to a source of the first access transistor and a source of the second access transistor.

12. The SRAM of claim 2, further comprising at least two voltage sources (Vss), electrically connected to a source of the first pull-down transistor and a source of the second pull-down transistor.

13. The SRAM of claim 2, further comprising at least two voltage sources (Vcc), electrically connected to a source of the first pull-up transistor and a source of the second pull-up transistor.

14. The SRAM of claim 1, further comprising a stop layer disposed between the first ILD layer and the second ILD layer.

15. The SRAM of claim 1, wherein the extending direction of the first contact plug is perpendicular to the arrangement direction of each fin-shaped structure.

16. The SRAM of claim 1, further comprising a third ILD layer disposed on the second ILD layer.

17. The SRAM of claim 16, further comprising at least one third contact plug, at least disposed within the third ILD, and electrically connected to a bottom plug of the SRAM cell.

18. The SRAM of claim 17, wherein the third contact plug is disposed within the third ILD layer and within the second ILD layer.

* * * * *